(12) United States Patent
Ding et al.

(10) Patent No.: US 8,791,540 B2
(45) Date of Patent: Jul. 29, 2014

(54) THIN SEMICONDUCTOR DEVICE HAVING EMBEDDED DIE SUPPORT AND METHODS OF MAKING THE SAME

(75) Inventors: Xiaoyi Ding, Lake Zurich, IL (US); Jeffrey J. Frye, Grayslake, IL (US); Gregory A. Miller, Mount Prospect, IL (US)

(73) Assignee: Continental Automotive Systems, Inc., Auburn Hills, MI (US)

( * ) Notice: Subject to any disclaimer, the term of this patent is extended or adjusted under 35 U.S.C. 154(b) by 285 days.

(21) Appl. No.: 13/404,461

(22) Filed: Feb. 24, 2012

(65) Prior Publication Data

US 2012/0153409 A1 Jun. 21, 2012

Related U.S. Application Data

(63) Continuation of application No. 12/473,179, filed on May 27, 2009, now Pat. No. 8,164,153.

(51) Int. Cl.
*H01L 29/82* (2006.01)
*G01L 9/00* (2006.01)
*H01L 21/683* (2006.01)
*B81C 1/00* (2006.01)

(52) U.S. Cl.
CPC ....... *G01L 9/0042* (2013.01); *B81B 2201/0235* (2013.01); *G01L 9/0055* (2013.01); *G01L 9/0052* (2013.01); *H01L 2221/68327* (2013.01); *H01L 2221/68381* (2013.01); *H01L 2221/6835* (2013.01); *H01L 21/6836* (2013.01); *H01L 21/6835* (2013.01); *B81B 2201/0264* (2013.01); *B81C 1/00873* (2013.01)
USPC ....................................................... 257/447

(58) Field of Classification Search
CPC ... G01L 9/0019; G01L 9/0042; G01L 9/0052; G01L 9/0055

USPC .................................................. 257/419, 447
See application file for complete search history.

(56) References Cited

U.S. PATENT DOCUMENTS 5,006,487 A 4/1991 Stokes ............................ 438/52
6,076,256 A * 6/2000 Drake et al. .................... 29/825

(Continued)

FOREIGN PATENT DOCUMENTS

DE 10246053 A1 4/2004
EP 1335411 A2 8/2003

OTHER PUBLICATIONS

Karthik S. Colinjivadi et al., "De-tethering of high aspect ratio metallic and polymeric MEMS/NEMS parts for the direct pick-and-place assembly of 3D microsystem" Microsystem Technologies;, Micro and Nanosystems Information Storage and Processing Systems, Jul. 25, 2008, pp. 1621-1626, XP019632896, vol. 14, No. 9-11, ISSN: 1432-1858, Springer, Berlin, DE.

(Continued)

*Primary Examiner* — Thomas L Dickey

(57) ABSTRACT

Ultra-thin semiconductor devices, including piezo-resistive sensing elements can be formed a wafer stack that facilitates handling many thin device dice at a wafer level. Three embodiments are provided to form the thin dice in a wafer stack using three different fabrication techniques that include anodic bonding, adhesive bonding and fusion bonding. A trench is etched around each thin die to separate the thin die from others in the wafer stack. A tether layer, also known as a tether, is used to hold thin dice or dice in a wafer stack. Such as wafer stack holds many thin dice together at a wafer level for handling and enables easier die picking in packaging processes.

35 Claims, 13 Drawing Sheets

(56) References Cited

U.S. PATENT DOCUMENTS

| | | |
|---|---|---|
| 6,608,370 B1 | 8/2003 | Chen |
| 2002/0115234 A1* | 8/2002 | Siniaguine .................. 438/107 |
| 2006/0211177 A1* | 9/2006 | Schaper et al. ............... 438/125 |
| 2008/0023813 A1 | 1/2008 | Hartwell et al. .............. 257/686 |

OTHER PUBLICATIONS

D. Heriban et al., "A mechanical de-tethering technique for silicon MEMS etched with a DRIE process; De-tethering MEMS", Journal of Micromechanics & Microengineering, May 1, 2009, p. 55011, XP020153418, vol. 19, No. 5, ISSN: 0960-1317, Institute of Physics Publishing, Bristol, GB.

Joachim N. Burghartz et al., "A New Fabrication and Assembly Process for Ultrathin Chips", IEEE Transactions on Electron Devices, Feb. 1, 2009, pp. 321-327, XP011241416, vol. 56, No. 2, ISSN: 0018-9383, IEEE Service Center, Piscataway, NJ, US.

Jingkuang Chen et al., "A Monolithic Three-Dimensional Ultrasonic Transducer Array for Medical Imaging", Journal of Microelectromechanical Systems, Oct. 1, 2007, p. 1017, XP011193311, vol. 16, No. 5, ISSN: 1057-7157, IEEE Service Center, Piscataway, NJ, US.

\* cited by examiner

THIN SEMICONDUCTOR DEVICE HAVING EMBEDDED DIE SUPPORT AND METHODS OF MAKING THE SAME

This application is a continuation application of U.S. application Ser. No. 12/473,179, entitled Thin Semiconductor Device Having Embedded Die Support and Methods of Making the Same, filed May 27, 2009, the entire contents of which are incorporated herein by reference.

BACKGROUND

Integrated circuits are being formed on smaller and thinner semiconductor die for a variety of reasons and applications. Relatively thin integrated circuits (ICs) or semiconductor die, also known as "ultra-thin" or "super-thin" ICs or die (also referred to as thin die below), are used in applications such as smart cards, smart labels, sensors and actuators. One example of a thin die application is for pressure sensors wherein a thin die containing a piezoresistive circuit is mounted on the top of a diaphragm in a pressure port to sense pressure.

When making and handling a thin die, care must be taken not to fracture or otherwise damage the die. A need therefore exists for improved methods and procedures to fabricate, separate, and transport thin dice for high volume applications where automated techniques are required to produce high throughput and acceptable yields.

It is already known to separate and handle integrated circuits on thin semiconductor wafers by mechanical grinding, chemical etching and dry etching with the assistance of adhesive or UV-reactive release tapes and carrier wafers. Some of the approaches taken in the electronics industry to separate thin wafers into die and to handle thin die include dicing by cutting and dicing by thinning. In dicing by cutting, a dicing tape is mounted on frames. The wafers are mounted to the dicing tape, backside down. Dicing is carried out by sawing, laser cutting and/or dry etching. After cutting, the die are separated on the dicing tape and sent to the assembly line on a wafer frame for pick and place. The thin dice are then ejected from the backside of the tape with the help of an ejector pin and picked by a vacuum tip. An example of this process flow is described in Muller et al., "Smart Card Assembly Requires Advanced Pre-Assembly Methods," SEMICONDUCTOR INTERNATIONAL (July 2000) 191.

In dicing by thinning, trenches are etched or sawed on the topside of a device wafer. Laminating tapes are then placed on a carrier wafer for mounting the carrier wafer to the topside of the device wafer. The bottom side of the device wafer is then thinned until the topside trenches are opened from the bottom side. A second carrier wafer is then mounted to the bottom side of the device wafer by a high-temperature release tape. The first carrier wafer is removed and then the thin die can be removed by locally heating a vacuum-picking tool. An example of this process flow requiring multiple carrier wafers and tape transfers is described in C. Landesberger et al., "New Process Scheme for Wafer Thinning and Stress-Free Separation of Ultra Thin ICs," published at MICROSYSTEMS TECHNOLOGIES, MESAGO, Dusseldorf, Germany (2001).

Alternatively, it has been known to saw or cut a carrier wafer into carrier chips, each of them carrying a thin die. In this case, the carrier chip is removed after die bonding by thermal release of the adhesive tape. An example of this process flow is described in Pinel et al., "Mechanical Lapping, Handling and Transfer of Ultra-Thin Wafers," JOURNAL OF MICROMECHANICS AND MICROENGINEERING, Vol. 8, No. 4 (1998) 338.

Conventional procedures have been met with a varying degree of success. The combination of carrier transfers and tape transfers necessitate multiple steps with long cycle times and yield loss. Moreover, the use of heat release and other tapes may exhibit unacceptable residual adhesion. When used in combination with an ejector pin, the edges may not delaminate from the tape due to the lack of flexural rigidity of the thin die and due to the die's small size in the in-plane directions. The small size of the die may also limit the net suction force that could be exerted by the vacuum tip to overcome residual tape adhesion. Conventional dicing and wafer sawing methods often damage thin die, which cause device failure or sensor performance degradation. Conventional ejector pins may exert excessive stress that damages the thin die, also causing cracking and device failure. Carrier transfer or tape transfer may lead to die contamination on both sides of the die. Multiple transfers by wafer carriers typically lead to lower yield due to increased handling and contamination. In the case of a very thin die for sensor applications, organic adhesive may leave residue on the die surface, causing poor bonding with the surface being measured. It is, therefore, desirable to provide an improved device and method of fabricating, separating and handling very thin dice to overcome most, if not all, of the preceding problems.

DETAILED DESCRIPTION

Figure 1:
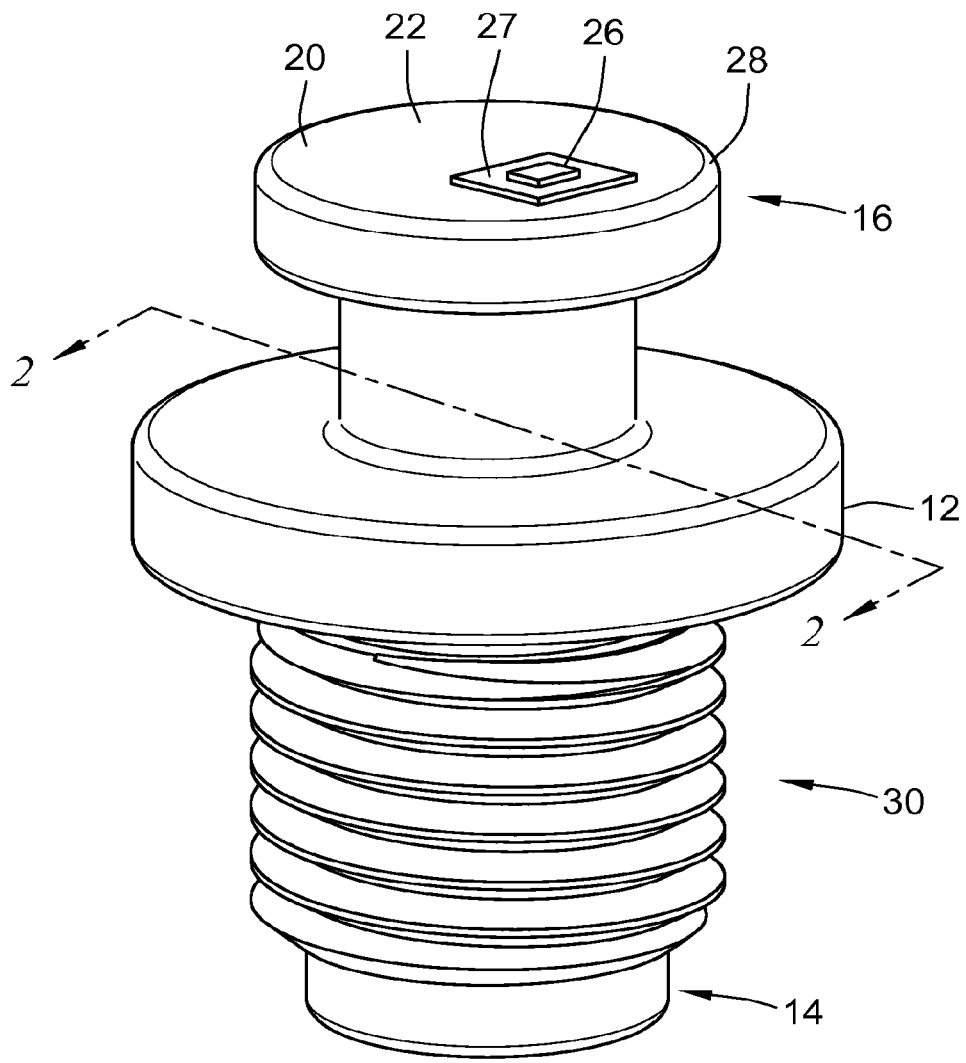
FIG. 1 is a perspective view of a sensing element in a pressure sensor.

FIG. 1 is perspective view of a sensing element 10 for a pressure sensor. The sensing element assembly 10, which is also referred to herein as simply a sensing element 10, is comprised of a sensor port body 12 having a bottom end 14 and a top end 16.

Figure 2:
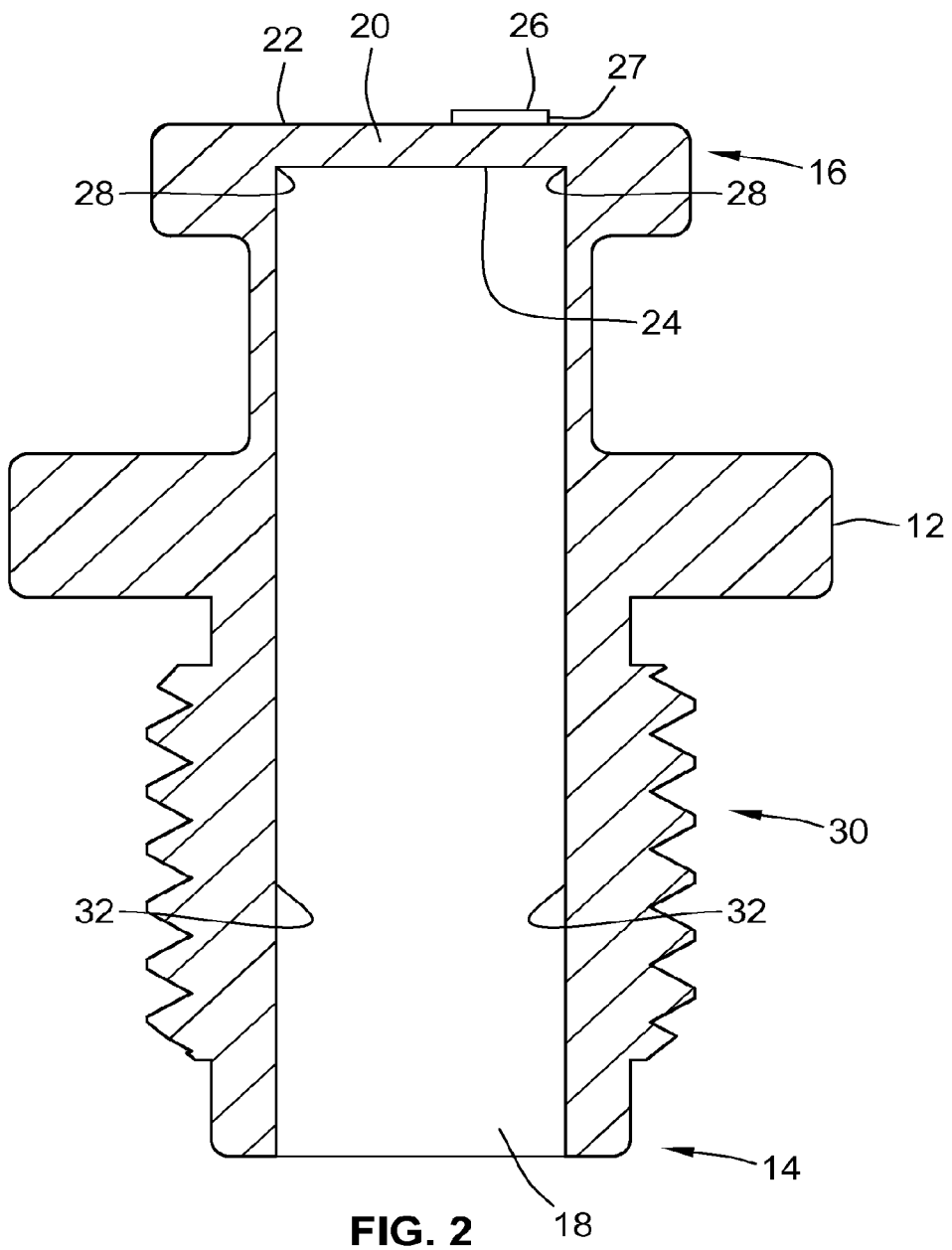
FIG. 2 is a cross-sectional diagram of a sensing element as shown in FIG. 1.

In FIG. 2, which is a cross-section view of the sensing element assembly 10 shown in FIG. 1, it can be seen that most of the interior of the sensor port body 12 is hollow, which provides the sensor port body 12 with an empty interior having the shape of an elongated cylinder 18 the sidewall of which is identified by reference numeral 32.

The cylinder 18 is formed to extend from and through the bottom end 14 toward the top end 16, and ends at relatively planar surface 24 proximate the top end 16. The portion of the sensor port body 12 located between the surface area 24 of the hollow cylinder 18 and a parallel surface area on the top end 16, defines a flexible diaphragm 20 having a diaphragm edge 28 defined by a geometric line that extends upwardly from the sidewall 32.

The diaphragm 20 has a top surface or side 22 and a bottom surface or side 24. In pressure sensor applications, a fluid (gas or liquid) in the hollow cylinder 18 exerts a pressure on the bottom side 24 of the diaphragm 20. The diaphragm 20 will therefore be deflected upwardly or downwardly depending on the difference between the pressure applied to the bottom side 24 and the pressure applied to the top side 22 of the diaphragm 20. As set forth more fully below, a semiconductor die 26 attached to the top side 22 includes a circuit, the electrical characteristics of which change in response to diaphragm deflection. For pressure sensor applications, the circuit in die 26 is a Wheatstone bridge circuit, made of piezoresistive resistors formed into the die 26. The resistance values of the piezoresistors change in response to the stress exerted on the die 26, which is caused by deflection of the diaphragm 20.

In order to measure fluid pressure in the cylinder 18, a thin die 26 having a nominal thickness between 5 to 50 microns, is fabricated to have a piezoresistive bridge circuit. The value of the resistive elements changes responsive to diaphragm deflections. The thin die 26 is mounted to the top side 22 of the diaphragm 20 by an adhesive material 27, that is preferably a frit glass.

As shown in FIGS. 1 and 2, the die 26 is located near the diaphragm edge 28. The die 26 is attached to the diaphragm 20 such that most of the die 26 is over the cylinder 18 but at least a portion of the die 26 is located at or near the diaphragm edge 28 so that the die 26 will experience a maximum stress change responsive to the diaphragm deflection by the pressure in the hollow cylinder 18 or on the top surface 22. It is the stress change induced in the die 26 by the diaphragm deflection responsive to the applied pressure signal that results in a resistance change of the piezoresistive Wheatstone bridge circuit in the die 26. The resistance change responsive to the applied pressure is electrically amplified and processed by electronic circuits, not shown for brevity but well-known to those of ordinary skill and which output an electrical signal representative of the pressure inside the cylinder 18, and in a format required by specific applications. For brevity, only the pressure sensing element assembly 10 depicted in FIGS. 1 and 2 is described. Electronic circuits and circuit components and packaging and assembly steps for making a complete pressure sensor, electrical connections, lead wires and calibration steps, which are well known in the art, are omitted for brevity.

Those of ordinary skill in the semiconductor arts know that hundreds or even thousands of individual semiconductor dice can be fabricated from a single wafer. The die 26 shown in FIG. 1 and FIG. 2 is therefore one of many such dice formed from a wafer.

Three methods or embodiments for making the die 26 from a wafer are described below. Each method of forming a die 26 uses a device wafer and a carrier or support wafer with one wafer stacked on top of the other. The vertical arrangement of two wafers is therefore considered to be a stack of wafers or a wafer stack.

The three methods or embodiments of fabricating the die 26 are referred to herein as a fusion bond method, an anodic bond method and an adhesive bond method with the terms, fusion, anodic and adhesive referring to the method and structure by which the two wafers (device and support) are joined or attached to each other. Any one of the three methods can be used to form a wafer stack that holds hundreds or thousands of die 26 depicted in FIGS. 1 and 2. For simplicity as well as clarity and brevity, only one die structure is shown in the accompanying figures, which depict steps of the three methods of forming the die 26 at a wafer level.

FIG. 3-FIG. 18 depict cross sectional views of making a wafer stack in different process steps and separating the thin die from the wafer stack in the first embodiment. The first embodiment uses a fusion bond to form the wafer stack. Two wafers that include a device wafer and a substrate wafer form the wafer stack. Two different types of device wafers can be used with the fusion bond method, namely a silicon wafer as shown in FIG. 3-FIG. 7, and a SOI wafer as shown in FIG. 8-FIG. 13.

Figure 19:
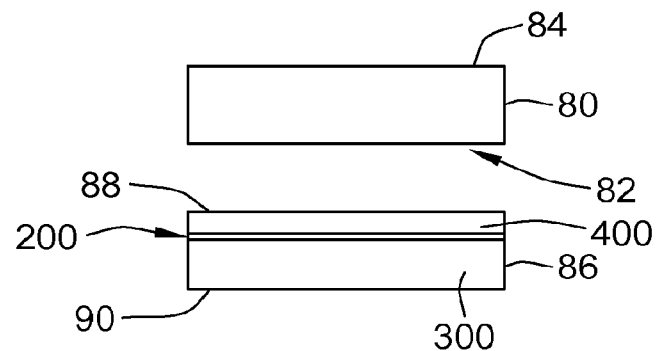
FIG. 19-FIG. 21 show the "front end" process steps in fabricating a wafer stack holding many thin dice to be used in a pressure sensing element as shown in FIG. 1 and FIG. 2 in second embodiment of using anodic bond to form the wafer stack and using a silicon-on-insulator (SOI) wafer as the device wafer.
Figure 20:
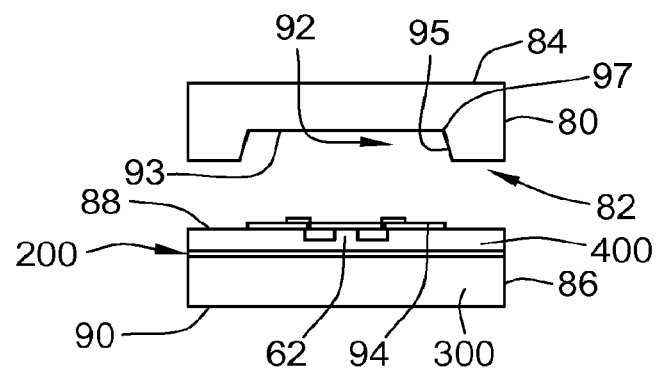
Figure 21:
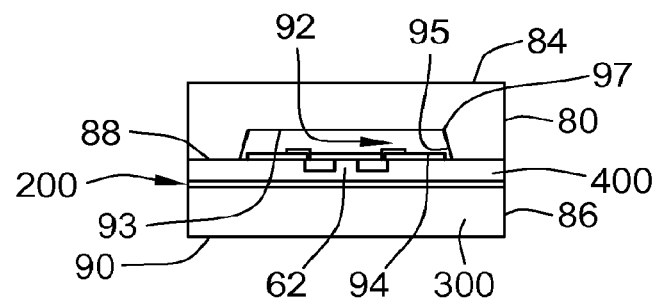

FIG. 19-FIG. 21 and FIG. 25-FIG. 27 depict cross sectional views of a second embodiment of a wafer stack and thus depict the corresponding process steps of a second method of making a wafer stack using an anodic bond between a device wafer and a substrate wafer to form the wafer stack. Two types of device wafers are preferably used in the second method, namely a single silicon wafer and a SOI wafer. Since the use of a single silicon wafer is described with regard to FIG. 3-FIG. 7, only the SOI wafer is shown in FIG. 19-FIG. 21.

FIG. 22-FIG. 24 and FIG. 25-FIG. 27 depict cross sectional views of making a third wafer stack and thus depict the corresponding process steps of a third method of making a wafer stack. The third embodiment uses an adhesive bond to form the wafer stack. As with the first two embodiments, the wafer stack is comprised of a device wafer and a substrate wafer.

Two types of device wafers are used in the third embodiment, which include, a single silicon wafer and a SOI wafer. The use of a single silicon wafer is described with regard to FIG. 3-FIG. 7. Only the SOI wafer is shown and described with regard to FIG. 22-FIG. 24.

Figure 3:
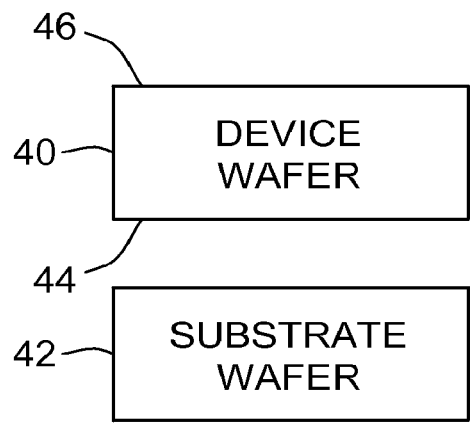
FIG. 3-FIG. 7 show the front end process steps in fabricating a wafer stack holding many thin dice to be used in a pressure sensing element as shown in FIG. 1 and FIG. 2 in one embodiment of using fusion bond to form the wafer stack and using a standard polished silicon wafer as the device wafer.

Referring now to FIG. 3, the first method starts with two silicon wafers 40 and 42. The top or upper wafer in FIG. 3 is referred to as a device wafer 40 because it will carry the aforementioned piezoresistive devices that include a Wheatstone bridge circuit. The device wafer 40 has a bottom surface 44 and an upper surface 46. The bottom or lower wafer is referred to as a substrate wafer 42 because its purpose or function is to support the device wafer during various process steps set forth below. Only one of each silicon wafer 40 and 42 is shown in FIG. 3. As mentioned above, two types of device wafers can be used with the first method depicted in FIGS.

3-7, which are a single silicon wafer and a SOI wafer. The use of a single silicon wafer is described in FIG. 3-FIG. 7.

Figure 4:
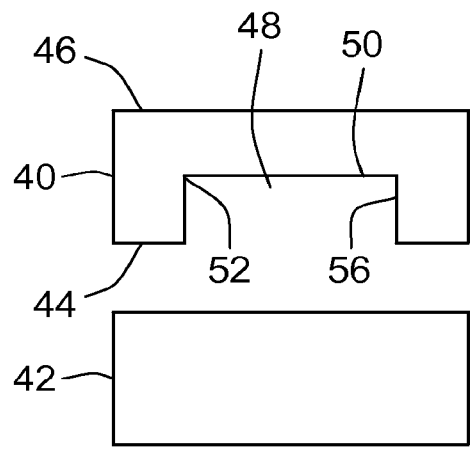

In FIG. 4, a first step of the first method is to form a cavity or recess 48 into the lower surface 44 of the device wafer 40 by an etching process. The depth of the recess 48 is preferably between about 5 to about 20 microns. After the recess 48 is formed, it has its own bottom surface 50. The bottom surface 50 is preferably formed to be planar or substantially planar. The intersection of the horizontal bottom surface 50 of the cavity or recess 48 with the substantially vertical side walls 56 of the cavity 48 that are formed during the etching process defines an outer perimeter 52 of the cavity 50.

Figure 5:
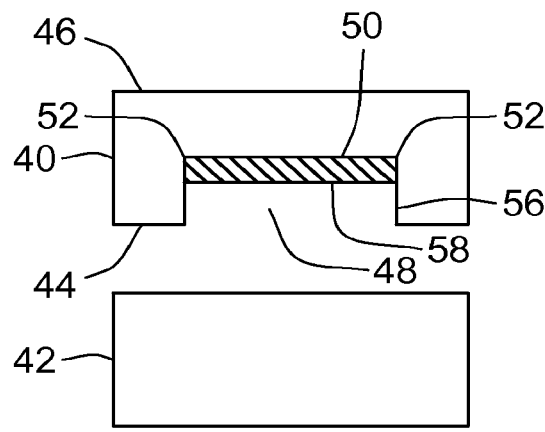

FIG. 5 depicts a next step of the first method. In this figure, a dielectric "tether" or dielectric tether layer 58 is formed over the substantially planar bottom 50 of the cavity 48. The dielectric tether layer 58 is preferably formed of silicone dioxide using thermal oxidation combined with polycrystalline silicon or silicon nitride using low pressure chemical vapor deposition (LPCVD). The tether layer 58 is thin and preferably formed to have a nominal thickness less than about 2 microns.

Figure 6:
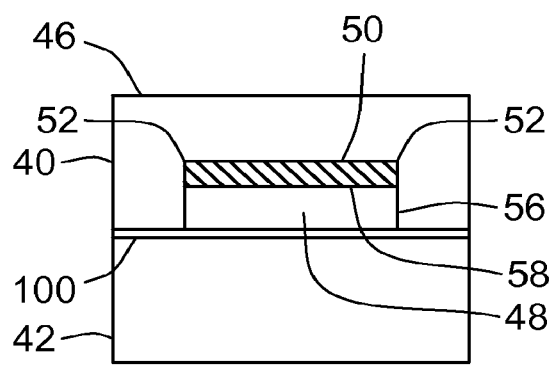

After the tether layer 58 is applied to the bottom 50 of the cavity 48, the next step of the first method is to attach the substrate wafer 42 to the device wafer 40, substantially as shown in FIG. 6. The substrate wafer 42 can be bonded to the device wafer 40 using a method known to those of ordinary skill in the art as fusion bonding. Since fusion bonding is normally done at a temperature higher than 1000° C., a thin layer of silicon oxide 100 will be formed in both the lower surface 44 of the device wafer 40 and the top surface of the substrate wafer 42 during the fusion bonding step. Depending on the bonding temperature and the gases used for the fusion bonding step, the thickness of silicon oxide layer 100 can be from less than 100 angstroms to a couple of microns.

Figure 15:
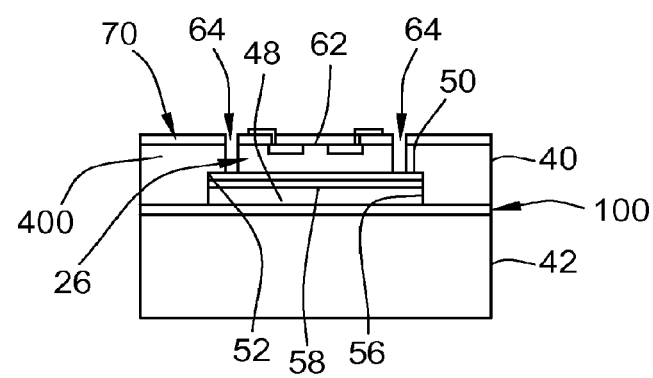

After the two wafers are fusion bonded, the next step of the method is to thin and polish the device wafer 40 from its top side 46 downward, until the device wafer 40 has a thickness meeting a thickness requirement of the thin die 26 as shown in FIG. 15. Thinning the device wafer 40 produces a new surface for the device wafer, the new surface being identified by reference numeral 70 and is referred to hereafter as the top surface 70 of the thin die 26, as shown in FIG. 7 and FIG. 15.

In one application pressure sensor application, the thickness of the thin die 26 after the thinning step is between about 10 microns to about 20 microns. The wafer thinning process starts from the top surface 46 of the device wafer 40 using methods known in the art of micro-fabrication, such as grind and polishing and chemical and mechanical polishing (CMP).

Figure 7:
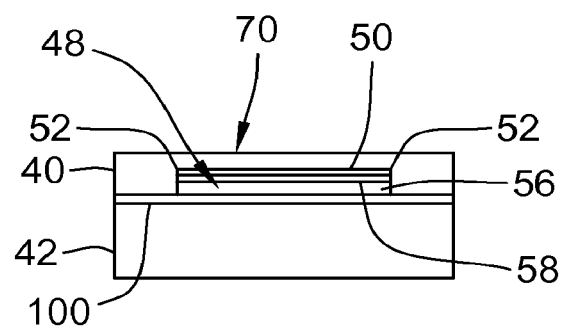

After the device wafer 40 is thinned, the wafer stack depicted in FIG. 7 is ready for what are considered herein to be "back-end" process steps. Before describing the backend process steps, however, it is important to describe a second method or process of using a fusion bond to form the wafer stack. This second method is depicted in FIG. 8-FIG. 13, which uses a SOI wafer as the device wafer.

Figure 8:
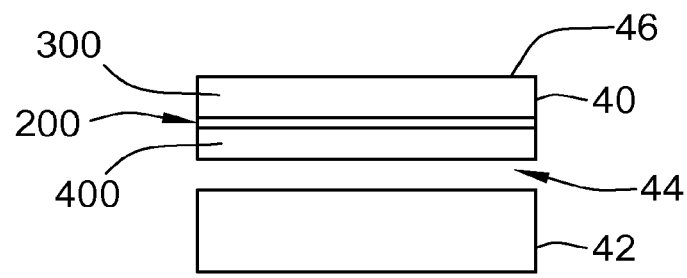
FIG. 8-FIG. 13 show the front end process steps in fabricating a wafer stack holding many thin dice to be used in a pressure sensing element as shown in FIG. 1 and FIG. 2 in one embodiment of using fusion bond to form the wafer stack and using a silicon-on-insulator (SOI) wafer as the device wafer.

FIG. 8 shows two starting wafers used to make the wafer stack using the fusion bond method. In FIG. 8, the device wafer is a SOI wafer 40A, having a bottom surface 44A and an upper surface 46A. The device wafer 40A is made of two silicon layers, a thick carrier layer 300 and a thin device layer 400.

The piezoresistive elements used to form a Wheatstone bridge circuit described above are fabricated in the thin device layer 400. The thin device layer 400 has a thickness substantially equal to the sum of the required thin die thickness, i.e., the thickness of the die 26, and the depth of the recess 48 etched into the thin device layer 400 in the first step of the fabrication process. The carrier layer 300 acts as a carrier for the thin device layer 400 and is removed during a subsequent wafer thinning step that takes place after the wafer bonding step.

In the method depicted in FIGS. 8-13, and as can be seen in FIGS. 8-12, a buried oxide (BOX) layer 200 is formed and located between the carrier layer 300 and the thin device layer 400. The thickness of the BOX layer can be from about 0.5 microns to about 3 microns.

Figure 9:
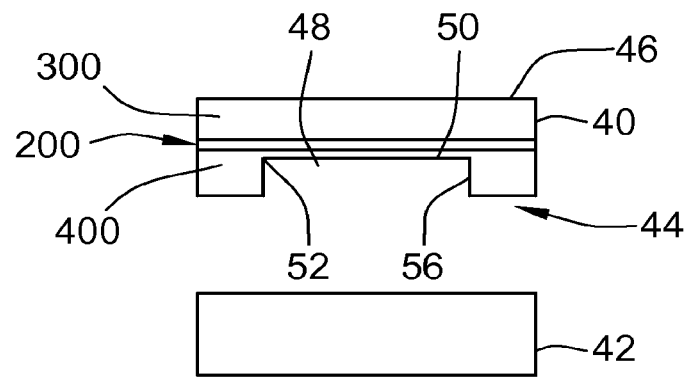

In FIG. 9, a first step is to form the aforementioned cavity or recess 48 into the bottom surface 44A of the thin layer 400 in device wafer 40A by an etching process. The depth of the recess 48 is preferably between about 5 microns to about 20 microns. When the recess 48 is formed, it has its own bottom surface 50 that is preferably formed to be planar or substantially planar. As with the previously described structure, the intersection of the horizontal bottom surface 50 of the cavity or recess 48 with the side walls 56 formed during the etching process defines an outer perimeter 52 of the cavity 48.

Figure 10:
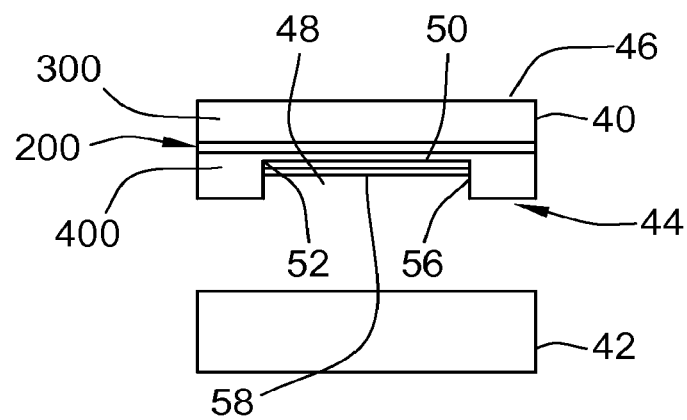

FIG. 10 depicts a next step of the first method using an SOI device wafer 40A. In FIG. 10, a dielectric tether layer 58 is formed over the bottom 50 of the cavity 48. The dielectric tether layer 58 is preferably formed of silicone dioxide using thermal oxidation combined with polycrystalline silicon or silicon nitride using low pressure chemical vapor deposition (LPCVD). The tether layer 58 is thin and preferably formed to have a nominal thickness less than about 2 microns.

Figure 11:
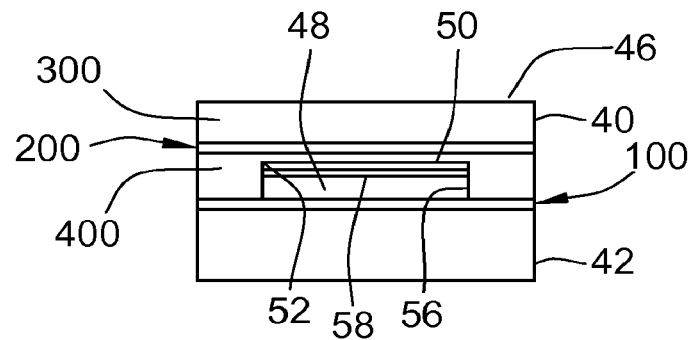

After the tether layer 58 is applied to the bottom 50 of the cavity 48, the next step of the first method using an SOI device wafer 40A is attaching the substrate wafer 42A to the device wafer 40A, as shown in FIG. 11. As with the embodiment depicted in FIGS. 3-7, in FIGS. 8-13, the two silicon wafers are bonded together by a fusion bond. Since fusion bond is done at a temperature normally higher than 1000° C., a thin layer of silicon oxide 100 will be formed in both bottom surface 44 of the device wafer and the top surface of the substrate wafer during the fusion bond step. Depending on the bonding temperature and the gases used for the fusion bond step, the thickness of the silicon oxide layer 100 can be from less than 100 angstroms to a couple of microns.

Figure 12:
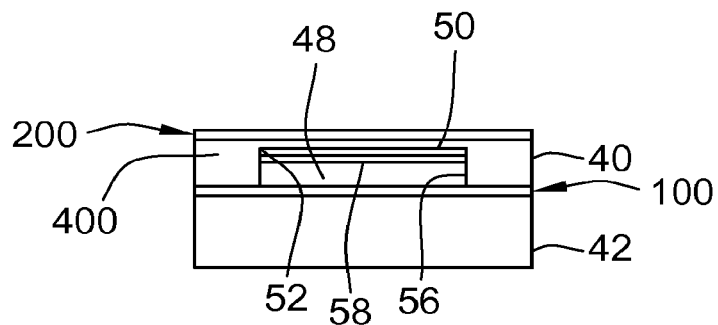

After the two wafers 40A and 42A are bonded together, the next step is to completely remove the carrier layer 300 portion of the device wafer 40A, as shown in FIG. 12. The preferred method of removing the carrier layer 300 uses a mechanical grinding step to remove most of the carrier layer 300 leaving only a thin residual carrier layer that is not visible in the figures. The residual carrier layer is then removed by a chemical thinning or etching step using potassium hydroxide (KOH) or other silicon-etching chemicals.

Figure 13:
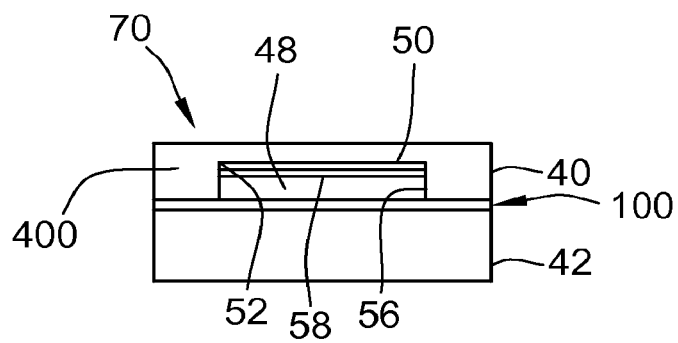

An advantage of using a SOI wafer as the device wafer as opposed to using two silicon wafers is that the BOX layer 200 can serve as an etch stop for the last chemical thinning step so that a thin device layer 400 with a uniform thickness and a smooth surface 70 can be obtained after the wafer thinning step and after the BOX layer 200 is etched away as shown in FIG. 13. After the BOX layer 200 is etched away, the wafer stack shown in FIG. 13 is ready for the aforementioned back-end process steps.

It should be pointed out that the cross-sectional view in FIG. 7 formed by using a single silicon wafer as the device wafer and in FIG. 13 formed by using a SOI wafer as the device wafer have the same structure. The two processes depicted in FIGS. 3-7 and 8-13 therefore use the same back-end process steps, which are described below.

Figure 14:
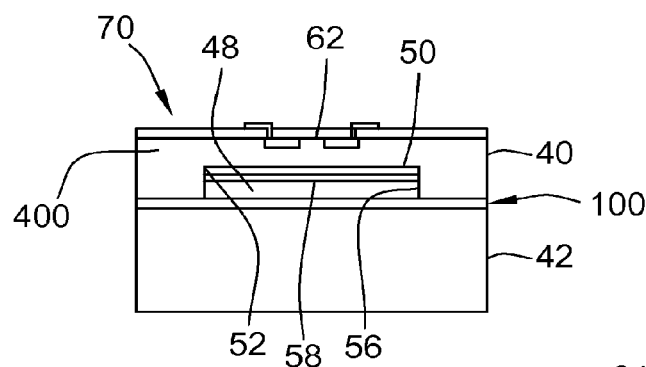
FIG. 14-FIG. 15 show the back end process steps in fabricating a wafer stack holding many thin dice to be used in a pressure sensing element as shown in FIG. 1 and FIG. 2 in one embodiment of using fusion bond to form the wafer stack.

Referring now to FIG. 14, in a first embodiment of a back-end process, the circuit 62 having a piezoresistive Wheatstone bridge is formed into the top surface 70 of the thin die 26 formed into a device wafer. For simplicity and brevity, the device wafer is identified by reference numeral 40, whether the device wafer is silicon or SOI.

Figure 16:
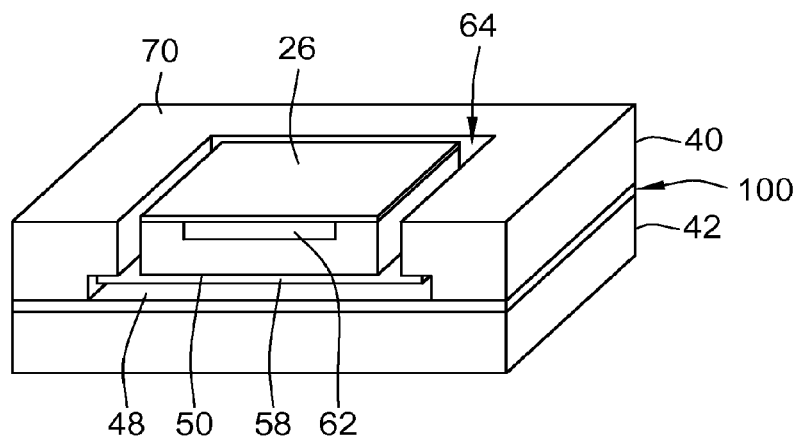
FIG. 16 shows a cross-sectional view of a completed wafer stack in one embodiment of using fusion bond to form the wafer stack.

After the circuit 62 is formed, a trench 64 is etched into the top surface 70 of the device wafer 40 all the way around the circuit 62 as shown in FIG. 15 and FIG. 16. Importantly, the trench 64 extends completely around the circuit 62 and thereby defines a perimeter of the circuit 62. Stated another way, the trench 64 is located outside of the area of the device wafer 40 in which the circuit 62 is formed and extends completely around the circuit 62. The trench 64 is also located inside the outer perimeter 52 of the cavity 48 that was formed in the device wafer 40. As described above, the outer perimeter 52 of the cavity 48 is considered to be the intersection of the substantially planar bottom surface 50 with the sidewalls 56 of the cavity 48. The formation of the trench 64 thus defines the die 26 having a piezoresistive Wheatstone bridge circuit, which will be picked/placed on the top side 22 of the diaphragm 20 as shown in FIG. 1-FIG. 2.

FIG. 16 shows a 3D cross-sectional view of a completed wafer stack in first embodiment of using fusion bond to form the wafer stack The trench 64 is formed by a silicon etching method, preferably deep reactive ion etch (DRIE), but can also use reactive ion etch (RIE) or chemical etch. In a preferred embodiment, the trench 64 is narrow and has a nominal width less than about 10 microns, all the way around the circuit that the trench 64 circumscribes. The narrow width of the trench 64 allows for more additional die 26 to be formed in a wafer level than would otherwise be possible using prior art methods that require the formation of trenches that are much wider.

The trench 64 is formed to extend from the top surface 70 of the device wafer 40 all the way down to the aforementioned tether layer 58. The tether layer 58 thus functions as an etch stop layer for the process used to form the trench 64. Once the trench 64 is formed all the way around the circuit 62, the only structure holding the die 26 in place is the tether layer 58.

In FIG. 15, the trench 64 is depicted as having two substantially vertical side walls that are orthogonal to the top surface 70 of the device wafer 40 due to the fact that the trench is preferably formed using DRIE, which will produce a nearly-vertical sidewall. In another embodiment that does not use DRIE but uses instead RIE or chemical etching, the trench sidewalls will be inclined or sloped. For purposes of claim construction however, the trench 64 is nevertheless considered to have an inner sidewall that defines a sidewall of the die 26. The trench 64 is also considered to have an outer sidewall that is spaced apart from the inner sidewall by the trench. The width of the trench 64 is also considered herein to be the spacing between the inner sidewall and the outer sidewall at the bottom of the trench, i.e., at tether layer 58. The inner sidewall of the trench 64 defines an inner perimeter of the trench; the outer sidewall of the trench 64 defines an outer perimeter of the trench. FIG. 16 shows a 3D cross-sectional view of a completed wafer stack using the first method described above and depicted in FIGS. 3-7 and 14-15.

Figure 17:
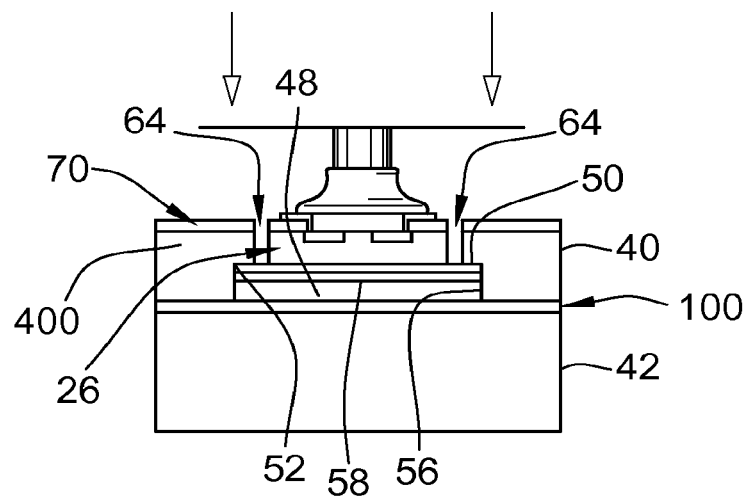
FIG. 17-FIG. 18 show the assembly steps for separating the thin die from the wafer stack formed by fusion bond.
Figure 18:
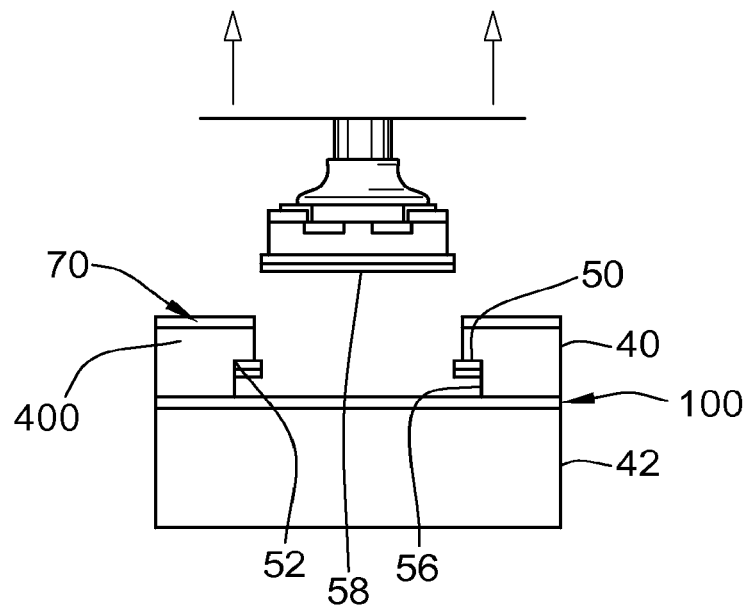

Referring now to FIG. 17-FIG. 18, the die 26 is separated from the wafer stack shown in FIG. 15 and FIG. 16 by breaking the tether layer 58. Since the tether layer 58 is very thin, i.e. less than about 2 microns, breaking the tether layer 58 is readily accomplished using a die handler and vacuum tip 66 such as the one depicted in FIG. 8 of U.S. Pat. No. 6,608,370, the teachings of which are incorporated herein by reference.

A first step of the separation process forces the die 26 downwardly and into the cavity 48 to break the tether layer 58, which defines the bottom of the trench 64. Once the tether layer 58 is broken around the trench 64, the vacuum tip 66 pulls the die 26 upwardly and away from the wafer stack as shown in FIG. 18. The die 26 can thereafter be processed to enable it to be attached to the diaphragm 20 of the sensing element shown in FIG. 1 and FIG. 2.

It should be noted in the foregoing description and in the accompanying figures that the tether layer 58 extends over substantially the entire bottom surface 50 of the cavity 48. The tether layer 58 is preferably a composite layer made of at least two dielectric materials, but can also be formed of one dielectric layer. Whether there is one such a layer or composite or multiple layers, the fact that the tether layer 58 extends over the bottom of the recess 48 and typically defines the bottom of the trench 64, the tether layer 58 can be considered to be a single tether since it is only one structure that holds the die 26 in the wafer stack.

In alternate embodiment, the tether layer 58 can be formed with holes during fabrication to have one or more holes or it can be perforated to have one or more holes after it is deposited, in order to facilitate die separation or the die attach process on diaphragm 20 of the sensing element shown in FIG. 1 and FIG. 2. In such an alternate embodiment, the perforated tether layer can also form multiple separate tethers, i.e., multiple separate structures holding the die 26 in the wafer stack.

While FIG. 17 and FIG. 18 show that the die 26 is separated by first urging the die 26 downward into the cavity 50 to break the tether layer 58 around the trench, in an alternate embodiment, the die 26 is not forced downwardly at all but is instead only pulled upwardly by the vacuum tip 66. Pulling the die upwardly will also break the tether layer 58 around the trench to free the die 26 from the device wafer 40.

Figure 22:
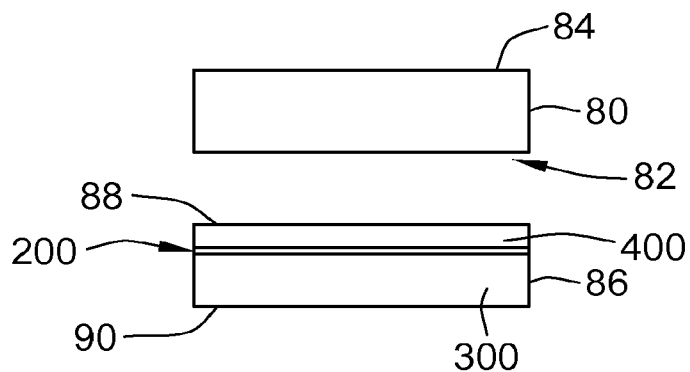
FIG. 22-FIG. 24 show the "front end" process steps in fabricating a wafer stack holding many thin dice to be used in a pressure sensing element as shown in FIG. 1 and FIG. 2 in third embodiment of using adhesive bond to form the wafer stack and using a silicon-on-insulator (SOI) wafer as the device wafer.

FIG. 19-FIG. 24 depict cross sectional views of making a wafer stack in different front end process steps of a second embodiment of using anodic bond and a third embodiment of using an adhesive bond to form the wafer stack. As shown in FIG. 19 and FIG. 22, the second and third methods of forming a wafer stack also use two wafers to form the wafer stack. The upper wafer 80 is a boron silicate glass wafer that is referred to herein as a cap wafer. The cap wafer 80 has a top surface 84 and a bottom surface 82.

In FIG. 19-24, the bottom wafer is a device wafer 86, which can be a single silicon wafer, but is preferably a SOI wafer. Since the use of a single silicon wafer is already described in the first method associated with FIG. 3-FIG. 7, only the SOI wafer is shown in FIG. 19-FIG. 24. As described above, the SOI device wafer 86 has two silicon layers, which are a thin device layer 400 having a top surface 88 and the carrier layer having a bottom surface 90. The two silicon layers are attached to each other through a buried oxide (BOX) layer 200.

In FIG. 20, a first step of the second method is to form a cavity or recess 92 into the bottom surface 82 of the cap wafer 80 by an etching process. The depth of the recess 92 is preferably between about 5 microns and about 20 microns. When the recess 92 is formed, it has its own bottom surface 93, preferably planar or substantially planar. The intersection of the horizontal bottom surface 93 of the cavity or recess 92 with the side walls 95 formed during the etching process defines an outer perimeter 97 of the cavity 92.

Figure 24:
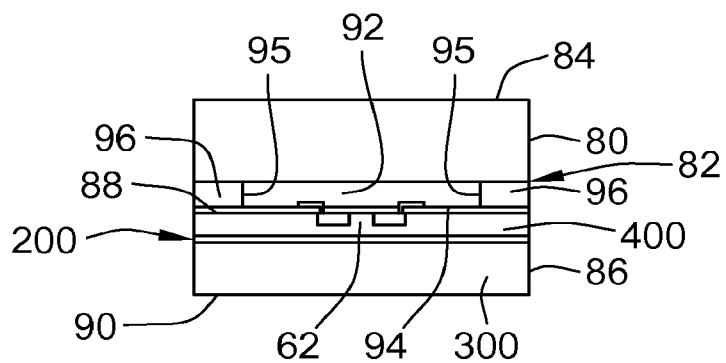

Separate and apart from the process used to form the cavity 92, the device wafer 80 is processed to form the aforementioned circuit 62 on the top surface 88 of the device wafer 80, as shown in FIG. 20. The circuit 62 formed in the device wafer 86 necessarily occupies a fixed and identifiable area, which will be separated from the thin device layer 400 by a trench 98 surrounding the circuit area, thus forming the thin die 26 as shown in FIG. 24. For purposes of simplicity and brevity, the circuit 62 and its corresponding perimeter are depicted as rectangular or square, however, the circuit and its perimeter can also assume other shapes that include a trapezoid, rhombus or other rectilinear shapes as well as circles, ellipses, triangles or other non-rectilinear shapes. however, the square or rectangular shape is most efficient in that it wastes less wafer space than other non-rectilinear shaped.

After the circuit 62 is fabricated, the top surface 88 is covered with a dielectric film 94 to passivate or protect the circuit 62 however, it is necessary to remove the dielectric passivation film material from metal bond pads that are used for making electrical connections to the circuit 62 in subsequent sensor element assembly steps. The passivation layer 94 should also be removed from a sealing zone that extends around the perimeter of the circuit 62 where the anodic bond is to be formed between the cap wafer 80 and the device wafer 86.

Figure 27:
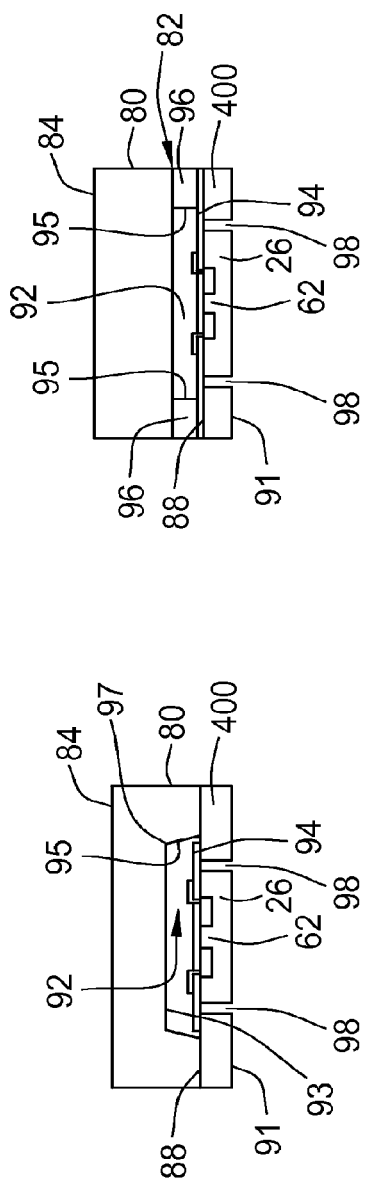

The passivation layer 94 is preferably a composite dielectric film having a thickness less than about 2 microns, preferably comprised of silicon dioxide and at least one of the dielectric materials such as LPCVD silicon nitride, PECVD silicon nitride and oxide. In one embodiment, the passivation layer 94 also serves as the "tether" or "tether layer" to support the thin die 26 when the trench 98 is formed as shown in FIG. 27. In another embodiment, the tether layer around the die outer perimeter and trench comprises layer 94 and a ductile film. The inclusion of a ductile material, such as aluminum, as a part of the tether layer tends to reduce the production of debris when the tether is broken during the die pick/place step in the sensing element assembly steps. In an alternative embodiment, a stand alone ductile metal or an organic film such as polyimde can be used as the tether layer.

FIG. 21 shows that after the recess 92 is formed on the cap wafer 80 and after the circuit 62 and tether layer 94 are formed in the device wafer 86, the two wafers 80 and 86 are attached to each other using an anodic bond. The anodic bond joins the bottom surface 82 of the cap wafer 80 and the top surface 88 of the device wafer 86. Since the anodic bond technique is well known to those of ordinary skill in the art, the details of forming an anodic bond are omitted for brevity.

As can be seen in FIG. 21, the area of the cavity 92 is large enough, i.e., the area enclosed by the cavity wall 95 is greater than the outer perimeter of the circuit 62. The cap wafer 80 thus encloses and protects the circuit 62 during subsequent processing steps. To simplify the description, before presenting the backend process steps for a second method, so-called front end process steps for a third method are described first because both methods share the same "backend" process steps.

The third method proposed to fabricate the wafer stack that holds many thin dice uses an adhesive bond to attach a cap wafer and a device wafer together. As shown in FIG. 22, the cap wafer 80 has a top surface 84 and bottom surface 82 and is preferably formed from a boron silicate glass wafer, but can also be formed from a silicon wafer. The device wafer 86 is preferably a SOI wafer, but can also be a single silicon wafer. Since the use of a single silicon wafer is already described in the first method associated with FIG. 3-FIG. 7, only the SOI wafer is described for the third method.

As described above, the SOI device wafer 86 has two silicon layers, a thin device layer 400 having a top surface 88 and the carrier layer having a bottom surface 90. The two silicon layers are attached to each other through a buried oxide (BOX) layer 200.

Figure 23:
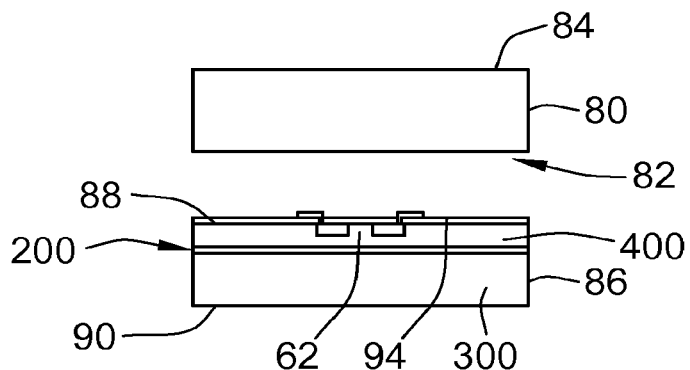

In FIG. 23, a first step of the third method is to form a circuit 62 on the top surface 88 of the device wafer 86. The circuit 62 necessarily occupies or requires a fixed and identifiable area which will be separated from the thin device layer 400 by a trench 98 surrounding the area, thus forming a thin die 26 as shown in FIG. 27. For purposes of simplicity the circuit 62 and its corresponding perimeter are usually rectangular or square. After completion of the circuit 62, the top surface 88 is covered with a dielectric film 94 to passivate the circuit 62. The passivation layer 94 should be removed from the metal bond pads for wire bonding in later sensing element assemble step. In an optional step, the layer 94 is removed from a sealing zone where the adhesive bonding between the cap wafer 80 and the device wafer 86 is formed.

The passivation layer 94 is a composite dielectric film having a thickness around or less than about 2 microns, and comprising of silicon dioxide and at least one of the dielectric materials such as LPCVD silicon nitride, PECVD silicon nitride and oxide. In one embodiment, this passivation layer 94 also serves as the tether layer to support the thin die 26 when the trench 98 is formed as shown in FIG. 27. In another embodiment, the tether layer around the die outer perimeter and trench area comprises layer 94 and a ductile film. The purpose of having the ductile material as a part of the tether layer is to minimize the quantities of the debris when the tether is breaking during the die pick/place step in the sensing element assembly steps. The ductile film is preferred to be aluminum, but can also be other metals or organic films such as polyimide.

In the step of attaching both wafers 80 and 86 together using adhesive bond as shown in FIG. 24, the adhesive 96 is formed into a picture frame shape with an inner perimeter 95 using a pattern. The area inside the inner perimeter 95 of the adhesive frame is free of the adhesive material and is larger than the circuit area 62 in the device wafer 86. This picture frame type adhesive layer surrounding and beyond the circuit area 62 forms a recess between the bottom surface 82 of the cap wafer 80 and the top surface 94 of the circuit 62. The thickness of the adhesive layer 96 which is also the depth of the recess is typically between 5 to 20 microns providing enough clearance of the bottom surface 82 of the cap wafer 80 from the top surface 94 of the circuit 62 in device wafer 86. A few of the materials that can be used for the adhesive bonding are frit glass and epoxy based polymer, for example benzocyclobutene.

As shown in FIG. 24, the wafer stack is ready for the so-called "backend" fabrication process steps, which are the same for the method using the wafer stack formed by an anodic bond. The following description does not distinguish which method is used to form a wafer stack but it should be kept in mind that the backend process steps shown in FIG. 25-FIG. 27 apply to both methods in which both cross-sectional views for two methods are shown.

Figure 25:
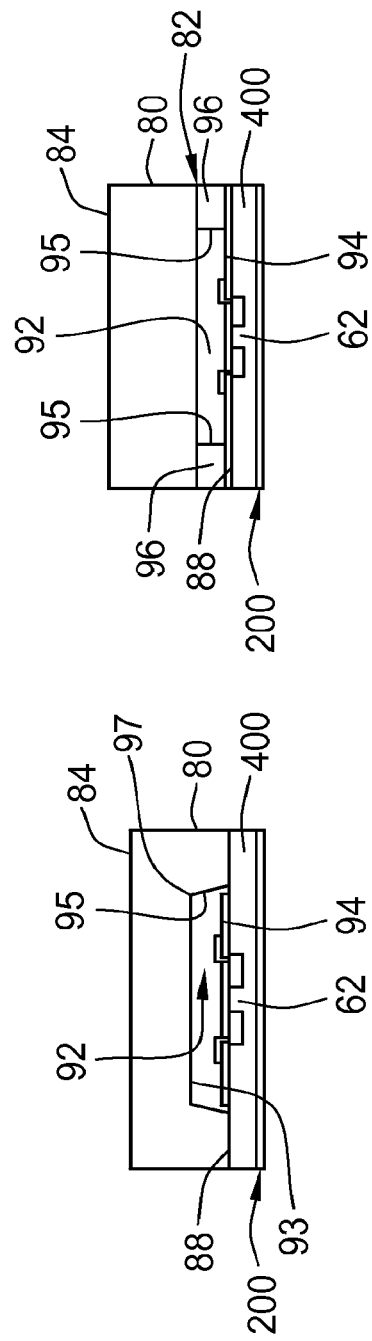
FIG. 25-FIG. 27 show the "back end" process steps in fabricating a wafer stack holding many thin dice to be used in a pressure sensing element as shown in FIG. 1 and FIG. 2, in the methods of using both anodic and adhesive bonds to form the wafer stack.
Figure 26:
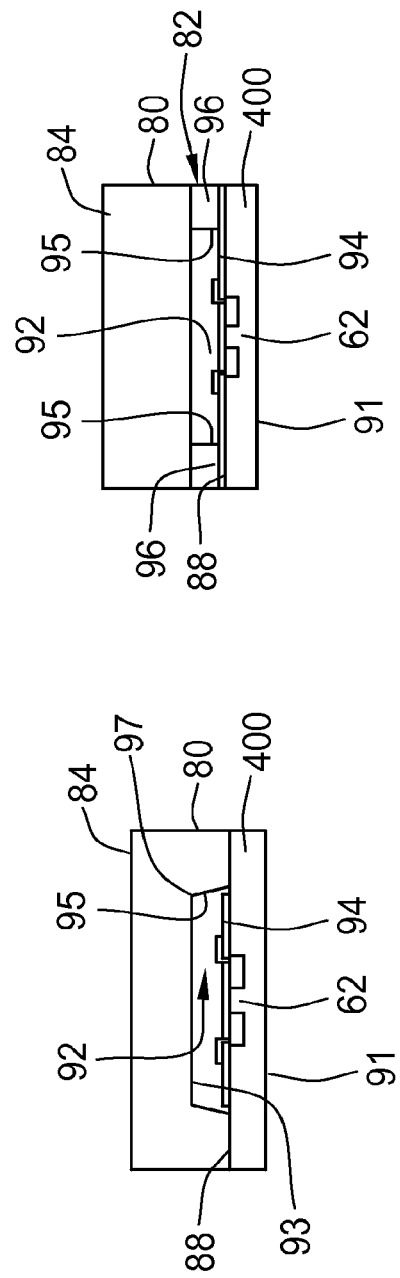

Referring now to FIG. 25, the next step is to remove the carrier layer 300 of the device wafer 86. A preferred method of removing the carrier layer 300 uses mechanical grinding to remove most of the carrier layer 300 and leave only a thin residual carrier layer. The thin residual layer is then removed by chemical thinning or etching using KOH or other silicon etch chemicals. An advantage of using a SOI wafer as the device wafer is that the BOX layer 200 can serve as an etch stop for the last chemical thinning step so that a thin device layer 400 with an uniform thickness and a smooth surface 91 is obtained after the wafer thinning step and etching away the BOX layer 200 as shown in FIG. 26.

After the device wafer 86 has been thinned down, a trench 98 is etched into the bottom surface 91 of the thinned device layer 400 as shown in FIG. 27. Unlike the trench 64 in the first method described above, the trench 98 in the second and third methods is etched from the bottom surface 91 of the die 26 having a circuit 62. Similar to the first method, however, the trench 98 is formed all the way through the thin device layer 400 to the tether layer 94. And, as with the previous embodiment, the tether layer 94 acts as an etch stop layer for the etching process used to form the trench 98.

Figure 28:
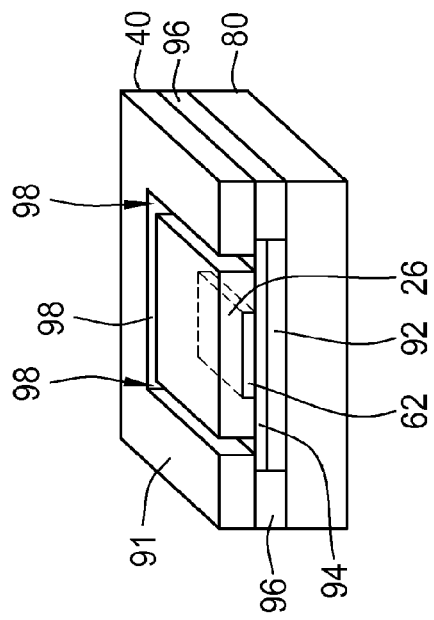
FIG. 28 shows a cross-sectional view of a completed wafer stack in one embodiment of using adhesive bond to form the wafer stack.
Figure 29:
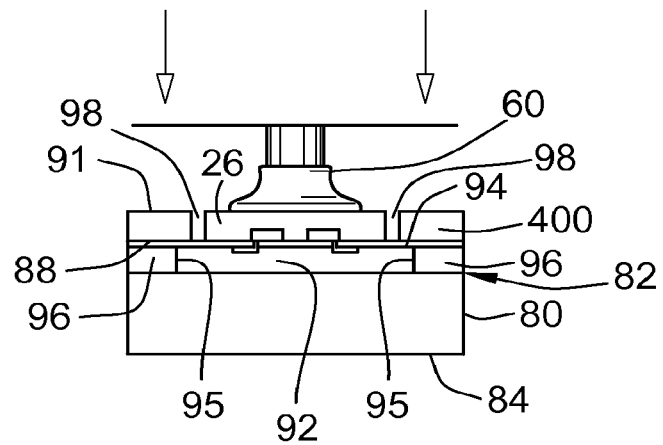
FIG. 29-FIG. 30 show the assembly steps for separating the thin die from the wafer stack formed by the fusion bond.
Figure 30:
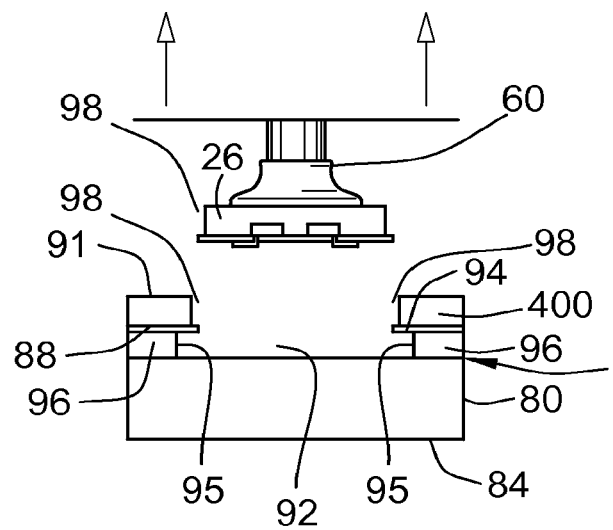

The trench 98 is formed from the bottom 91 of the thin device layer 400 where it is outside or beyond the outer perimeter the circuit 62 but inside the cavity sidewalls 95. When the trench 98 is formed all the way around the circuit 62 and defines the die 26, which remains in place in the wafer stack until the die 26 is picked from the wafer stack by breaking the tether layer 94. The formation of the trench 98 around the circuit 62 thus defines the die 26 used in the pressure sensing element assembly in FIG. 1 and FIG. 2. FIG. 28 is a perspective cross-sectional view of a wafer stack having thin die 26 supported by the tether 94 in the third method. The die 26 so formed is separated from the wafer using a process essentially the same steps depicted in FIGS. 17 and 18 above, but which is depicted in FIG. 29 and FIG. 30 for completeness.

The die 26 is separated from the device wafer stack by a vacuum tip 66 that is applied or contacts the bottom surface 91 of the die 26. As with the structure shown in FIGS. 17 and 18 and the method described therewith, the vacuum tip 66 can be used to force the die 26 downward into the cavity 92 to break the tether 94 as shown in FIG. 29, or directly pull the die 26 upwardly and away from the cavity 92 to break the tether layer 94 as shown in FIG. 30.

Those of ordinary skill in the art will recognize that the die 26 on the pressure sensing element assembly 10 of a pressure sensor depicted in FIG. 1 and FIG. 2 is formed in and separated from a wafer stack using either method depicted in FIGS. 3-30. Thereafter, the die 26 is attached to the top side 22 of the diaphragm 20, as depicted in FIG. 1 and FIG. 2, by an adhesive layer 27, preferred to be frit glass, so that the die 26 will exert near the maximum stress change responsive to the diaphragm deflection by the applied pressure signal in the hollow cylinder 18 in FIG. 1-FIG. 2. It is the stress change induced by the diaphragm deflection responsive to the applied pressure signal that results in a resistance change of the piezoresistive Wheatstone bridge device in the die 26. This resistance change signal responsive to the applied pressure signal is electrically amplified and processed by the electronics to output an electrical signal in a format required by specific applications.

For brevity and clarity, only the pressure sensing element assembly 10 of a pressure sensor is described. Components and assembly steps for making a complete pressure sensor, such as sensor packaging, other electric circuits and components, and connection and calibration steps are well known in the art and not addressed in the text and figures.

Those of ordinary skill in the electronics arts will recognize that the resistance changes of a Wheatstone bridge circuit responsive to a pressure applied to either side of the diaphragm can be detected and/or converted into an electrical signal by various different electronic circuits and methods but which are not described and shown in the text and figures for clarity.

The foregoing description of the methods forming a pressure sensing element, and methods of fabricating thin electrical devices in a wafer level or in a wafer stack, and separating dice from a wafer stack and mounting a die on to a pressure port are all for purposes of illustration only. The true scope of the invention is set forth in the appurtenant claims.

What is claimed is:

1. A wafer stack comprising:
   a silicon device wafer and a silicon substrate wafer;
   a silicon die having a circuit formed thereon the device wafer, the die extending over a cavity in the device wafer and having an outer perimeter defined by a trench formed in the device wafer, the trench separating the die from the device wafer; and
   a single tether attached to the die, extending across the trench and ending on the device wafer.

2. A wafer stack comprising:
   a silicon device wafer and a silicon substrate wafer;
   a silicon die having a circuit formed thereon the device wafer, the die extending over a cavity in the device wafer and having an outer perimeter defined by a trench formed in the device wafer, the trench separating the die from the device wafer; and a die tether layer attached to the die, extending across the trench and ending on the device wafer.

3. The wafer stack of claim 1 or 2 wherein the die tether layer is a substantially planar layer formed on the bottom of the silicon die facing to the cavity, and wherein the die tether layer is comprised of at least one of: silicon oxide, silicon nitride and poly silicon.

4. The wafer stack of claim 1 or 2, wherein the die tether layer is perforated.

5. The wafer stack of claim 1 or 2, wherein the die tether layer has a thickness less than about two microns.

6. The wafer stack of claim 1 or 2, wherein the die tether layer is a layer formed using at least one of:
   thermal oxidation;
   low pressure chemical vapor deposition (LPCVD); and
   plasma enhanced chemical vapor deposition (PECVD).

7. The wafer stack of claim 1 or 2, wherein the trench has a width less than about ten microns.

8. The wafer stack of claim 1 or 2, wherein the die has a nominal thickness and wherein the open trench has a depth substantially equal to the die nominal thickness.

9. The wafer stack of claim 1 or 2, wherein the trench has a bottom and wherein the trench bottom is comprised of material of the die tether layer.

10. The wafer stack of claim 1 or 2, wherein the die tether layer is an etch stop layer for an etching process used to form the trench.

11. The wafer stack of claim 1 or 2, wherein the trench is formed by etching.

12. The wafer stack of claim 1 or 2 wherein the circuit on the die forms part of pressure sensor.

13. The wafer stack of claim 1 or 2, wherein the wafer stack is made of two silicon wafers attached to each other by a fusion bond, the trench separating the silicon die from the device wafer, and a single tether or a die tether layer attaching the silicon die to the device wafer.

14. The wafer stack of claim 1 or 2 wherein the trench is etched onto the top surface of the device wafer.

15. The wafer stack of claim 1 or 2 wherein the trench formed in the device wafer is around the circuit.

16. A wafer stack comprising:
   a thin silicon device layer having top and bottom surfaces and a cap wafer;
   at least one die formed on a portion of the thin silicon device layer, and having a circuit on the die;
   a tether covering at least a portion of the top surface of the die and extending over the die;
   an anodic bonding between the cap wafer and top surface of the thin silicon layer;

wherein the cap wafer is over the die and forms a sealed gap between the top surface of the die and the cap wafer;

wherein the die has an outer perimeter defined by a trench formed from a bottom surface of the thin silicon device layer and surrounding the die, the die being attached to the wafer stack by the tether extending over the trench, said tether extending across the trench.

17. The wafer stack of claim 16, wherein the tether is a substantially planar layer formed on the topside of the die and at least portion of the top surface of the thin silicon layer.

18. The wafer stack of claim 17, wherein the tether is an etch stop layer for an etching process used to form the trench.

19. A wafer stack comprising:
a thin silicon device layer having top and bottom surfaces and a cap wafer;
a die formed on a portion of the thin silicon device layer and having a circuit on the top surface of the die;
a tether covering at least a portion of the top surface of the die and extending over the die;
wherein the cap wafer is suspended over the die and forms a sealed gap, and wherein the die has an outer perimeter defined by a trench formed from the bottom surface of the thin silicon device layer and surrounding the die, the die being attached to the wafer stack by the passivation layer extending over the trench;
an anodic bonding between the cap wafer and top surface of the thin silicon layer;
wherein said tether extends across the trench attaching the die to the wafer stack.

20. The wafer stack of claim 19, wherein the cap wafer is comprised of a borosilicate glass.

21. The wafer stack of claim 19, wherein the cap wafer is comprised of single crystalline silicon.

22. The wafer stack of claim 19, 20 or 21, further comprising an adhesive bond in an adhesive bonding zone between the cap wafer and the top surface of the thin silicon layer.

23. The wafer stack of claim 22, wherein an inner perimeter of the adhesive bond zone defines an outer perimeter of a gap between the cap wafer and the top surface of the die, the thickness of the adhesive layer defining a height of the gap.

24. The wafer stack of claim 19, wherein the trench is configured to be formed after fabricating the circuit and tether.

25. The wafer stack of claim 19, wherein the cap wafer encloses at least one die having a circuit on the top surface of the die within the outer perimeter of the cap wafer.

26. The wafer stack of claim 19, wherein the tether includes at least one layer comprised of at least one of:
silicon oxide;
silicon nitride;
polyimide;
polysilicon;
a film of ductile metal.

27. The wafer stack of claim 19, wherein the tether has a thickness less than about two microns.

28. The wafer stack of claim 19, wherein the tether is formed using at least one of:
thermal oxidation;
low pressure chemical vapor deposition (LPCVD);
plasma enhanced chemical vapor deposition (PECVD);
sputtering of ductile metals;
evaporation of ductile metals;
coating with polyimide.

29. The wafer stack of claim 19 wherein the trench has a width less than about ten microns.

30. The wafer stack of claim 19 wherein the die has a nominal thickness and wherein the trench has a depth substantially equal to the die nominal thickness.

31. The wafer stack of claim 19, wherein the trench has a bottom and wherein the trench bottom is comprised of material of the tether layer.

32. The wafer stack of claim 19, wherein the tether layer is an etch stop layer for a an etching process used to form the trench.

33. The wafer stack of claim 19, wherein the trench is formed by silicon etching.

34. The wafer stack of claim 19, wherein the tether layer is perforated.

35. The wafer stack of claim 19, wherein the circuit forms part of a pressure sensor.

* * * * *